(12) United States Patent
Kikuchi et al.

(10) Patent No.: US 12,432,895 B2
(45) Date of Patent: Sep. 30, 2025

(54) SOLDER PRINTING INSPECTION DEVICE

(71) Applicant: CKD CORPORATION, Aichi (JP)

(72) Inventors: Kazuyoshi Kikuchi, Aichi (JP);
Tsuyoshi Ohyama, Aichi (JP);
Norihiko Sakaida, Aichi (JP)

(73) Assignee: CKD Corporation, Aichi (JP)

( * ) Notice: Subject to any disclaimer, the term of this patent is extended or adjusted under 35 U.S.C. 154(b) by 349 days.

(21) Appl. No.: 18/190,996

(22) Filed: Mar. 28, 2023

(65) Prior Publication Data

US 2023/0232603 A1 Jul. 20, 2023

Related U.S. Application Data

(63) Continuation of application No. PCT/JP2021/027300, filed on Jul. 21, 2021.

(30) Foreign Application Priority Data

Oct. 7, 2020 (JP) ................................. 2020-169513

(51) Int. Cl.
*H05K 13/08* (2006.01)
*G06T 7/00* (2017.01)
(Continued)

(52) U.S. Cl.
CPC ......... *H05K 13/0817* (2018.08); *G06T 7/001* (2013.01); *G06T 7/50* (2017.01);
(Continued)

(58) Field of Classification Search
CPC ........... H05K 13/0817; H05K 13/0465; H05K 13/083; G06T 7/001; G06T 7/50;
(Continued)

(56) References Cited

U.S. PATENT DOCUMENTS

| | | | |
|---|---|---|---|
| 10,126,252 B2* | 11/2018 | Haugen | .................. H04N 23/74 |
| 11,927,435 B2* | 3/2024 | Okuda | ........................ G06T 7/00 |
| 2014/0125375 A1* | 5/2014 | Lee | ................... G05B 19/41875 |
| | | | 324/763.01 |

FOREIGN PATENT DOCUMENTS

| | | |
|---|---|---|
| JP | 2012-021909 A | 2/2012 |
| JP | 2017-075899 A | 4/2017 |

(Continued)

OTHER PUBLICATIONS

Office Action issued in counterpart Japanese Patent Application No. JP 2020-169513 mailed Dec. 14, 2021 (5 pages).

(Continued)

*Primary Examiner* — Shefali D Goradia
(74) *Attorney, Agent, or Firm* — Osha Bergman Watanabe & Burton LLP

(57) ABSTRACT

A solder printing inspection device includes: an illumination device that irradiates, with a predetermined light, a printed circuit board on which a solder paste is printed; an imaging device that takes an image of the printed circuit board irradiated with the predetermined light and obtains image data; and a control device that: based on the image data, obtain three-dimensional measurement data of the solder paste printed on the printed circuit board, based on the three-dimensional measurement data, extracts upper portion shape data of an upper portion of the solder paste, the upper portion having a height equal to or higher than a predetermined height, and compares the upper portion shape data with a predetermined criterion and determines whether a quality of a three-dimensional shape of the upper portion of the solder paste is good or poor.

10 Claims, 9 Drawing Sheets

(51) Int. Cl.
  *G06T 7/50*  (2017.01)
  *H05K 13/04*  (2006.01)
(52) U.S. Cl.
  CPC .............. *G06T 2207/30141* (2013.01); *G06T 2207/30152* (2013.01); *H05K 13/0465* (2013.01)
(58) Field of Classification Search
  CPC . G06T 2207/30141; G06T 2207/30152; G06T 2207/20084; G01B 11/24
  See application file for complete search history.

(56) References Cited

FOREIGN PATENT DOCUMENTS

| WO | WO-2012096004 A1 * | 7/2012 | ............. G01B 11/24 |
| WO | WO-2013073427 A1 * | 5/2013 | .......... B41F 15/0881 |
| WO | 2020/031984 A1 | 2/2020 | |
| WO | 2020/122033 A1 | 6/2020 | |

OTHER PUBLICATIONS

Office Action issued in counterpart Japanese Patent Application No. JP 2020-169513 mailed May 10, 2022 (4 pages).
International Preliminary Report on Patentability issued in International Application No. PCT/JP2021/027300; mailed on Apr. 20, 2023, with translation (10 pages).

* cited by examiner

SOLDER PRINTING INSPECTION DEVICE

BACKGROUND

Technical Field

The present disclosure relates to a solder printing inspection device configured to perform an inspection for the printing state of solder paste printed on a printed circuit board.

Description of Related Art

In general, a substrate manufacturing line of mounting electronic components on a printed circuit board first prints solder pastes on lands of a printed circuit board (solder printing process). The substrate manufacturing line then temporarily mounts electronic components on the printed circuit board by taking advantage of the viscosity of the solder pastes (mounting process). The substrate manufacturing line subsequently leads this printed circuit board into a reflow furnace to heat and melt the solder pastes and perform soldering (reflow process).

In such a substrate manufacturing line, a solder printing inspection device is generally provided to perform an inspection for the printing state of solder pastes printed on the printed circuit board.

For example, a known configuration of the solder printing inspection device performs three-dimensional measurement of a solder paste printed on a printed circuit board to obtain various measurement data with regard to the solder paste, for example, the printing position, the area, the height and the volume and compares the measurement data with inspection reference data set in advance, so as to determine the good/poor quality of the printing state of the solder paste (as described in, for example, PTL 1).

Patent Literature

PTL 1: JP 2017-75899A

Even when the various measurement data, such as the printing position, the area, the height, and the volume of a solder paste satisfy inspection criteria at the stage of solder printing inspection in the conventional configuration, however, a soldering defect (a joint defect) may be found after reflow: for example, a tiny solder scrap (hereinafter referred to as "solder ball") 205 adhering to a side of a land 3 on the printed circuit board 1 or a cavity 206 formed in a solder joint portion (melt-solidified solder paste) 202 between an electrode 25a of an electronic component and a land 3 as shown in FIGS. 10A-10B. The inappropriate soldering of an electronic component is likely to increase the rate of rejection.

There may be various causes of the soldering defect found after reflow. One of the causes may be the quality of a three-dimensional shape of a solder paste printed on a land in a solder printing process prior to reflow.

In a reflow process where the solder paste is heated and melted, a flux included in the solder paste is vaporized. Melting of the solder paste in the reflow process starts from an outer side of the solder paste exposed to the high temperature outside air and proceeds inward.

Accordingly, for example, in the case where a recess $5c$ is present in a top portion of a solder paste 5 printed on a land 3 as shown in FIG. 9A and an electrode 25a of an electronic component is placed on the recess 5c as shown in FIG. 9B, an exposed portion 5d of the solder paste 5 that is melted earlier in an initial stage of the reflow process and that is generally called "wall of melted solder" or the electrode 25a of the electronic component placed on the solder paste 5 blocks the outflow path (escape way) of the flux included in an inner non-melted part of the solder paste 5 and a vapor of the flux to the outside and may cause the flux vapor to be accumulated inside of the recess 5c.

When the flux vapor accumulated in the recess 5c breaks through the exposed portion 5d (the wall of the melted solder) to be ejected, this presses out the melted solder paste 5 (or a non-melted solder paste 5) to form the solder ball 205.

When the flux vapor accumulated in the recess 5c is not discharged but causes melt-solidification of the solder paste 5, on the contrary, the cavity 206 is formed in the solder joint portion 202.

The three-dimensional shape of the solder paste 5, which is likely to cause such a soldering defect after reflow as described above, is not limited to the shape with the recess 5c formed therein as shown in FIG. 9A. For example, in the case where a solder paste 5 printed on a land 3 has a distorted shape and has a varying thickness, a flux vapor is not readily discharged from the thicker portion. This may lead to a similar defect to that described above.

SUMMARY

By taking into account the circumstances described above, one or more embodiments of the present disclosure provide a solder printing inspection device that reduces, for example, the occurrence of a soldering defect.

The following describes each of various aspects of the present disclosure. Functions and advantageous effects that are characteristic of each of the aspects are also described as appropriate.

Aspect 1. There is provided a solder printing inspection device configured to perform a pre-reflow (at a stage prior to a reflow process and prior to mounting of components) inspection for a printing state of a solder paste printed on a printed circuit board. The solder printing inspection device comprises an irradiation unit (i.e., an illumination device) configured to irradiate the printed circuit board with a predetermined light; an imaging unit (i.e., an imaging device) configured to take an image of the printed circuit board irradiated with the predetermined light; a three-dimensional measurement unit (i.e., a control device) configured to obtain three-dimensional measurement data of a predetermined solder paste printed (a solder paste printed at a predetermined position) on the printed circuit board, based on image data obtained by the imaging unit; an upper portion shape data extraction unit (i.e., the control device) configured to extract upper portion shape data with regard to an upper portion of the predetermined solder paste having a height equal to or higher than a predetermined height, based on the three-dimensional measurement data of the predetermined solder paste obtained by the three-dimensional measurement unit; and an upper portion shape good/poor quality judgment unit (i.e., the control device) configured to compare the upper portion shape data with regard to the predetermined solder paste with a predetermined criterion, so as to determine whether a quality of a three-dimensional shape of the upper portion of the predetermined solder paste is good or poor.

The "predetermined height" described above may be any height position set arbitrarily except a predetermined height reference plane (measurement reference plane). The same applies to the aspects described below. For example, the "predetermined height" may be a height position higher by a predetermined distance than a height position of a predetermined height reference plane, for example, an upper face of a land which a solder paste is printed on or an upper face of a resist in the periphery of the land, or may be a height position lower by a predetermined distance than a measured height position of a top portion of a solder paste.

The configuration of Aspect 1 described above first obtains three-dimensional measurement data of a predetermined solder paste printed on the printed circuit board, based on the image data obtained taking an image of the predetermined solder paste. The configuration of Aspect 1 subsequently extracts upper portion shape data with regard to an upper portion of the predetermined solder paste having the height equal to or higher than the predetermined height, based on this three-dimensional measurement data of the predetermined solder paste. The configuration of Aspect 1 then compares this upper portion shape data with the predetermined criterion, so as to determine whether the quality of the three-dimensional shape of the upper portion of the predetermined solder paste is good or poor.

One exemplified configuration may compare a three-dimensional shape (upper portion shape data) with regard to an upper portion of a predetermined solder paste printed on a land at a predetermined position, as an inspection target, with a predetermined three-dimensional shape (upper portion shape data) set in advance as the predetermined criterion and perform the good/poor quality judgment by determining whether a difference is within an allowable range.

The "predetermined criterion (predetermined three-dimensional shape)" set in advance may be, for example, upper portion shape data with regard to an upper portion of a solder paste that has a predetermined three-dimensional shape and that is regarded as a non-defective by an operator or may be upper portion shape data with regard to an upper portion of a solder paste prior to reflow printed on a land at a predetermined position (at the same position as the position of the inspection target), which does not cause any soldering defect after reflow.

The configuration of this aspect enables a location of a shape defect (for example, a recess) of the solder paste that is likely to cause a soldering defect (for example, a solder ball or a cavity) found after reflow to be detected in advance in a solder printing inspection process prior to reflow. It is difficult to detect such a location of a shape defect by only a conventional inspection that performs the determination based on the comparison of, for example, the area, the height or the volume of each solder paste printed on the printed circuit board. As a result, the configuration of this aspect suppresses the occurrence of a soldering defect after reflow.

Furthermore, the configuration of this aspect performs the good/poor quality judgment not with regard to the entire three-dimensional shape of a solder paste printed at a predetermined position on the printed circuit board but with regard to the three-dimensional shape of only an upper portion of the solder paste (upper portion shape data). This configuration reduces the load of the processing, compared with the configuration of performing the good/poor quality judgment with regard to the entire solder paste.

The ideal shape of the solder paste 5 printed on the land 3 of the printed circuit board is an approximately rectangular sectional shape as shown in FIG. 8A. In the actual state, however, a lower part of the solder paste 5 has a spread portion 5a that is formed at a base joined with the land 3 to be gently sloped and extended, due to, for example, bleeding of the solder paste 5 from the periphery of an opening of a screen mask in the process of printing or fall of solder particles from a side face of the solder paste 5 after printing.

The solder spread portion 5a formed as described above naturally has an unstable shape, and the respective solder pastes 5 have individually different shapes of the solder spread portions 5a. In the case where the three-dimensional shape of the entire solder paste 5 including the solder spread portion 5a is set as a comparison inspection target, the allowable range of the criterion is required to be enlarged. This is likely to lower the accuracy of the inspection. This also significantly increases the load of the processing.

Potential issues possibly caused by a shape defect of a lower portion of the solder paste 5 including the solder spread portion 5a are, for example, an area defect, a positional misalignment and the occurrence of a solder bridge that is formed across a plurality of lands and that causes a short circuit in the circuit structure on the printed circuit board. With regard to such issues, however, it is possible to perform the good/poor quality judgment based on, for example, a two-dimensional shape of the solder paste 5. It is not necessarily required to perform the good/poor quality judgment of the three-dimensional shape.

The configuration of this aspect excludes the three-dimensional shape inspection with regard to the lower portion (the spread portion) of the solder paste and thereby allows for the three-dimensional shape inspection of the solder paste with the high inspection efficiency and the high inspection accuracy, which has conventionally been practically difficult.

Aspect 2. The solder printing inspection device described in above Aspect 1 may further comprise a storage that stores a neural network and an identification unit (generated model), wherein the identification unit is generated by learning of the neural network which includes an encoding portion (encoder) that extracts a characteristic amount from input shape data and a decoding portion (decoder) that reconstructs shape data from the characteristic amount, with using only upper portion shape data with regard to a non-defective solder paste as learning data. The upper portion shape good/poor quality judgment unit may comprise a reconstructed shape data obtaining unit configured to input the upper portion shape data with regard to the predetermined solder paste extracted by the upper portion shape data extraction unit, as original upper portion shape data, into the identification unit and to obtain upper portion shape data with regard to the predetermined solder paste reconstructed by the identification unit, as reconstructed upper portion shape data; and a comparison unit configured to compare the original upper portion shape data with the reconstructed upper portion shape data. The upper portion shape good/poor quality judgment unit may be configured to determine whether the quality of the three-dimensional shape with regard to the upper portion of the predetermined solder paste is good or poor, based on a result of comparison by the comparison unit.

The "upper portion shape data with regard to the non-defective solder paste" used as the "learning data" may be, for example, shape data accumulated by previous solder printing inspections. The same applies to the aspects described below. For example, upper portion shape data with regard to an upper portion of a non-defective solder paste prior to reflow printed on the land of the printed circuit board, which does not cause any soldering defect after reflow may be used as the "learning data". This is, however, not essential. For example, upper portion shape data with regard to an upper portion of a non-defective solder paste having no shape defect, such as a recess or a localization, selected by the operator's visual observation after printing of the solder paste may be used as the "learning data".

The "neural network" described above includes, for example, a convolutional neural network having a plurality of convolutional layers. The "learning" described above includes, for example, deep learning. The "identification unit" (generated model) described above includes, for example, an autoencoder and a convolutional autoencoder.

Unlike the shapes of non-defective solder pastes, defective locations of defective solder pastes, which are likely to cause soldering defects, such as a solder ball and a cavity after reflow, have a variety of shapes. Even in the configuration of excluding the three-dimensional shape inspection with regard to the lower portion (the spread portion) of the solder paste and performing the good/poor quality judgment in the three-dimensional shape with regard to only the upper portion of the solder paste (upper portion shape data) like the configuration of above Aspect 1, it is substantially impossible to store all the possible patterns of defective shapes and to detect a defective shape of each solder paste as an inspection target by pattern matching or the like.

The solder paste is formed by kneading fine solder particles of approximately 30 μm in size with a flux and readily collapses. The solder pastes printed on the respective lands on an identical printed circuit board accordingly have various shapes. Even in a configuration of storing a predetermined non-defective shape as a criterion and determining shapes out of an allowable range of the criterion as defective, it is difficult to set the criterion and it may be significantly difficult to create an algorithm for detecting a location of a shape defect of the solder paste.

The configuration of above Aspect 2, on the other hand, uses the identification unit (the generated model), such as an autoencoder, built by learning of the neural network to determine whether the upper portion of the solder paste printed on the land of the printed circuit board has any location of a shape defect, which is likely to cause a soldering defect, such as a solder ball or a cavity, after reflow. Unlike the conventional configuration that has difficulty in detecting the location of a shape defect, the configuration of this aspect enables the location of a shape defect of the solder paste to be detected with high accuracy.

Furthermore, the configuration of this aspect compares the original upper portion shape data (upper portion shape data as original) obtained by three-dimensional measurement of a predetermined solder paste as an inspection target with reconstructed upper portion shape data (upper portion shape data reconstructed) obtained by reconstruction based on the original upper portion shape data. The two shape data to be compared with each other are free from the effects of differences in imaging conditions on the printed circuit board-side as the inspection object (for example, the arrangement position, the arrangement angle, and the deflection of the printed circuit board) and in imaging conditions on the inspection device-side (for example, the illumination state and the angle of view of a camera). Accordingly, this configuration enables the location of a shape defect to be detected with the higher accuracy.

In the process of performing a three-dimensional shape inspection with regard to a solder paste printed on a land at a predetermined position on a printed circuit board, a configuration that needs, as a criterion for good/poor quality judgment, printing set information (for example, position data, dimension data and shape data) with regard to the land at the predetermined position and the solder paste printed on the land as an inspection target stores in advance substrate design information such as gerber data, individually obtains printing set information with regard to a land at a predetermined position and a solder paste printed on the land as each inspection target, and performs the good/poor quality judgment of a three-dimensional shape of the solder paste printed on the land at the predetermined position as the inspection target, based on comparison with the printing set information. This is likely to significantly lower the inspection efficiency. This also requires accurate positioning of the printed circuit board at the inspection position.

The configuration of this aspect, on the other hand, uses the identification unit such as an autoencoder, to perform a three-dimensional shape inspection of the solder pastes printed on the respective lands. There is accordingly no need to store in advance the printing set information with regard to a large number of lands present on the printed circuit board and the individual solder pastes printed on the lands or to refer to the printing set information for the three-dimensional shape inspection. This accordingly enhances the inspection efficiency.

Furthermore, for example, unlike a configuration that compares upper portion shape data obtained by three-dimensional measurement of an upper portion of a solder paste at a predetermined position as an inspection target with a predetermined criterion (non-defective upper portion shape data) set in advance corresponding to the predetermined position, the configuration of this aspect does not require alignment of the inspection target with the criterion or adjustment such as rotation of the direction (posture) of the criterion relative to the inspection target, This configuration accordingly increases the speed of the three-dimensional shape inspection. As a result, this significantly reduces the required number of processing steps in the three-dimensional shape inspection of one solder past and significantly increases the processing speed of the inspection.

Aspect 3. In the solder printing inspection device described in either above Aspect 1 or above Aspect 2, the upper portion shape data extraction unit may be configured to extract the upper portion shape data by excluding at least lower portion shape data with regard to a lower portion of the predetermined solder paste that includes a spread portion of the solder paste and that has a height lower than the predetermined height, from the three-dimensional measurement data of the predetermined solder paste obtained by the three-dimensional measurement unit.

As described above, the "predetermined height" may be set arbitrarily except the predetermined height reference plane (measurement reference plane). For example, the "predetermined height" may be (1) a "height corresponding to one particle diameter of solder" from a predetermined height reference plane, such as an upper face of a land or an upper face of a resist; (2) a "height of 20 to 40 μm" from the predetermined height reference plane; (3) a "height of one third of the printing height of a non-defective solder paste"; or (4) a "height of one third of the thickness of a screen mask used in the process of solder printing".

Aspect 4. In the solder printing inspection device described in any of above Aspects 1 to 3, the irradiation unit may be configured to radiate a light for three-dimensional measurement (for example, a patterned light having a striped light intensity distribution), as the predetermined light, and the three-dimensional measurement unit may be configured to obtain the three-dimensional measurement data of the predetermined solder paste, based on image data obtained by the imaging unit through radiation of the light for three-dimensional measurement.

The configuration of above Aspect 4 utilizes, for example, a predetermined three-dimensional measurement method to obtain the three-dimensional measurement data of the solder paste and thereby enables a three-dimensional shape of a solder paste including a location of a shape defect to be detected with higher accuracy. As a result, this configuration improves the accuracy of the inspection.

As one example of this "three-dimensional measurement method" is a phase shift method that obtains three-dimensional measurement data, based on a plurality of image data obtained under a plurality of patterned lights having different phases.

Aspect 5. The solder printing inspection device described in any of above Aspects 1 to 4 may further comprise a three-dimensional good/poor quality judgment unit (i.e., the control device) configured to determine whether a quality of predetermined three-dimensional information (for example, a volume or a height) with regard to the predetermined solder paste is good or poor, based on the three-dimensional measurement data of the predetermined solder paste obtained by the three-dimensional measurement unit.

The configuration of above Aspect 5 performs the good/poor quality judgment of the predetermined three-dimensional information (for example, the volume or the height) with regard to the solder paste, in addition to the configuration described in above Aspect 1 or the like. This further improves the accuracy of the inspection.

Aspect 6. The solder printing inspection device described in any of above Aspects 1 to 5 may further comprise a two-dimensional good/poor quality judgment unit (i.e., the control device) configured to determine whether a quality of predetermined two-dimensional information (for example, an area, a position, a two-dimensional shape or a solder bridge) with regard to the predetermined solder paste is good or poor, based on the three-dimensional measurement data of the predetermined solder paste obtained by the three-dimensional measurement unit.

The configuration of above Aspect 6 performs a two-dimensional inspection of the solder paste, in addition to the configuration described in above Aspect 1 or the like. This further improves the accuracy of the inspection. Performing the two-dimensional inspection like the configuration of this aspect enables a substantial inspection with regard to a lower portion (including a spread portion having an unstable shape) of the solder paste excluded in the three-dimensional shape inspection of above Aspect 1 or the like to be performed without significantly increasing a load.

Aspect 7. In the solder printing inspection device described in any of above Aspects 1 to 5, the irradiation unit may be configured to radiate a light for two-dimensional measurement (for example, a uniform light), as the predetermined light. The solder printing inspection device may further comprise a two-dimensional measurement unit (i.e., the control device) configured to obtain two-dimensional measurement data of the predetermined solder paste, based on image data obtained by the imaging unit through radiation of the light for two-dimensional measurement; and a two-dimensional good/poor quality judgment unit (i.e., the control device) configured to determine whether a quality of predetermined two-dimensional information (for example, an area, a position, a two-dimensional shape or a solder bridge) with regard to the predetermined solder paste is good or poor, based on the two-dimensional measurement data of the predetermined solder paste obtained by the two-dimensional measurement unit.

The configuration of above Aspect 7 has similar functions and advantageous effects to those of the configuration of Aspect 6 described above.

BRIEF DESCRIPTION OF DRAWINGS

FIG. 8A illustrates a solder paste having an ideal sectional shape; FIG. 8B illustrates a non-defective solder paste without any location of a shape defect; and FIG. 8C illustrates a predetermined height of a solder paste;

FIG. 9A illustrates a solder paste with a recess formed on a top portion thereof; and FIG. 9B illustrates the state that an electrode of an electronic component is placed on the recess; FIG. 10A illustrates the solder joint portion and its periphery viewed from a side; and FIG. 10B illustrates the solder joint portion and its periphery viewed from a top.

DETAILED DESCRIPTION OF EMBODIMENTS

Figure 1:
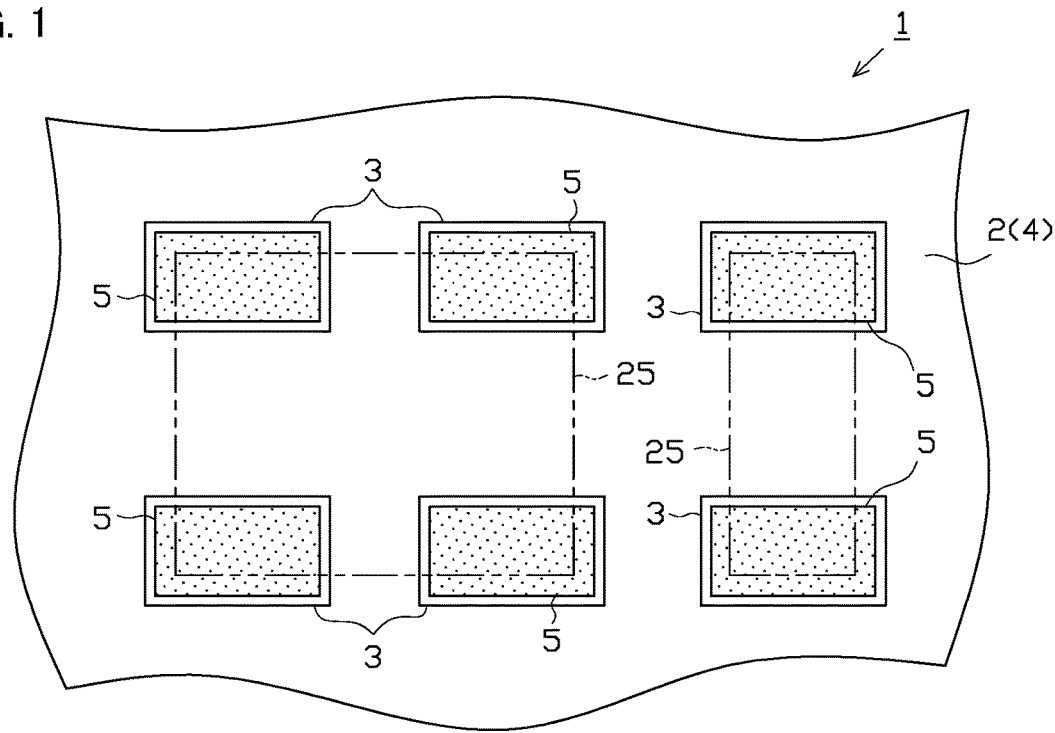
FIG. 1 is a partly enlarged plan view illustrating closeup of part of a printed circuit board.

The following describes embodiments of a solder printing inspection device. The configuration of a printed circuit board that is an object of inspection by the solder printing inspection device is described first. FIG. 1 is a partly enlarged plan view illustrating closeup of part of a printed circuit board.

As shown in FIG. 1, a printed circuit board 1 is configured by forming a wiring pattern (not shown) made of copper foil and a plurality of lands 3, on a surface of a base substrate 2 in a flat plate-like shape made of, for example, a glass epoxy resin. The surface of the base substrate 2 is coated with a resist film 4 in portions other than the lands 3. Solder paste 5 that is a measurement target is printed on the lands 3. As a matter of convenience, portions representing the solder paste 5 are filled with dotted patterns in FIG. 1.

Figure 2:
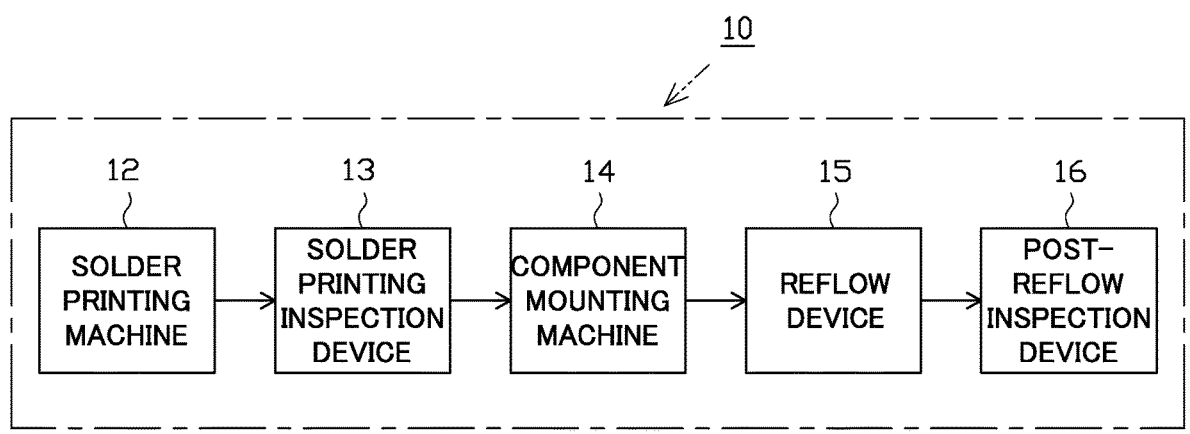
FIG. 2 is a block diagram illustrating the configuration of a manufacturing line of the printed circuit board.

A manufacturing line (a manufacturing process) of manufacturing the printed circuit board 1 is described next with reference to FIG. 2. FIG. 2 is a block diagram illustrating the configuration of a manufacturing line 10 of the printed circuit board 1. The manufacturing line 10 according to one or more embodiments is set to convey the printed circuit board 1 from the left side to the right side when being viewed from the front side.

As shown in FIG. 2, in the manufacturing line 10, a solder printing machine 12, a solder printing inspection device 13, a component mounting machine 14, a reflow device 15, and a post-reflow inspection device 16 are placed sequentially from an upstream side thereof (from the left side in FIG. 2).

The solder printing machine 12 performs a solder printing process of printing the solder paste 5 on each of the lands 3 of the printed circuit board 1. According to one or more embodiments, the solder paste 5 is printed by screen printing. More specifically, a procedure of screen printing brings a lower face of a screen mask with a plurality of openings formed therein corresponding to the respective lands 3 on the printed circuit board 1, in contact with the printed circuit board 1. The procedure subsequently supplies the solder paste 5 onto the screen mask and slides a squeegee to fill the openings with the solder paste 5. The procedure then separates the printed circuit board 1 from the lower face of the screen mask, so that solder pastes 5 in predetermined shapes are printed on the respective lands 3 of the printed circuit board 1.

Figure 8A:
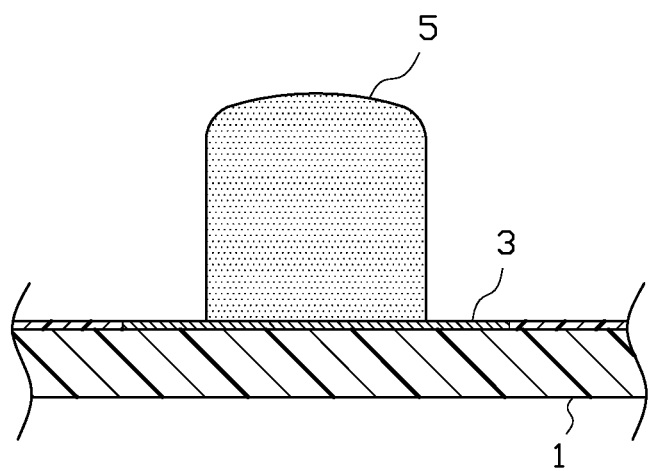
FIGS. 8A-8C are each partly enlarged sectional views of a printed circuit board illustrating a solder paste printed on a land.

The ideal shape of the solder paste 5 printed on the land 3 of the printed circuit board is an approximately rectangular sectional shape as shown in FIG. 8A. In the actual state, however, a lower part of the solder paste 5 has a spread portion 5a that is formed at a base joined with the land 3 to be gently sloped and extended, due to, for example, bleeding of the solder paste 5 from the periphery of the opening of the screen mask in the process of printing or fall of solder particles from a side face of the solder paste 5 after printing.

The solder printing inspection device 13 performs a solder printing inspection process of checking the state of the solder paste 5 printed on the lands 3. The details of the solder printing inspection device 13 will be described later.

The component mounting machine 14 performs a component mounting process (mounting process) of mounting an electronic component 25 (shown in FIG. 1) on the lands 3 with the solder pastes 5 printed thereon. The electronic component 25 has a plurality of electrodes 25a (shown in, for example, FIGS. 9A-9B), each of which is temporarily fixed to a predetermined solder paste 5.

The reflow device 15 performs a reflow process of heating and melting the solder paste 5 and solder-joining (soldering) the lands 3 with the electrodes 25a of the electronic component 25.

Figure 10A:
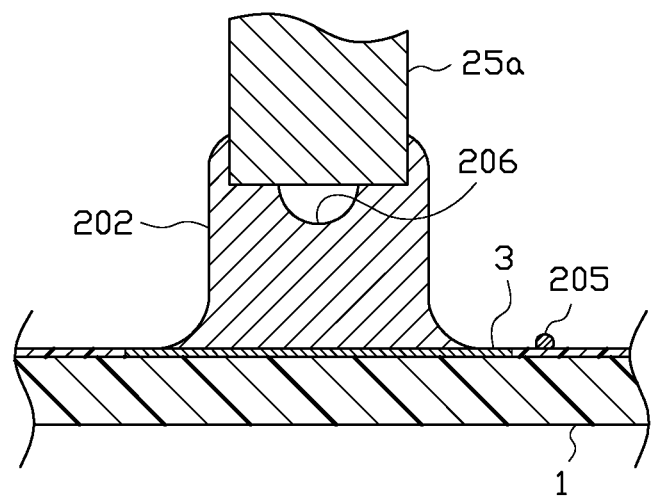
FIGS. 10A-10B are each partly enlarged sectional views of a printed circuit board illustrating a solder joint portion with a solder ball or a cavity formed therein and its periphery after reflow.
Figure 10B:
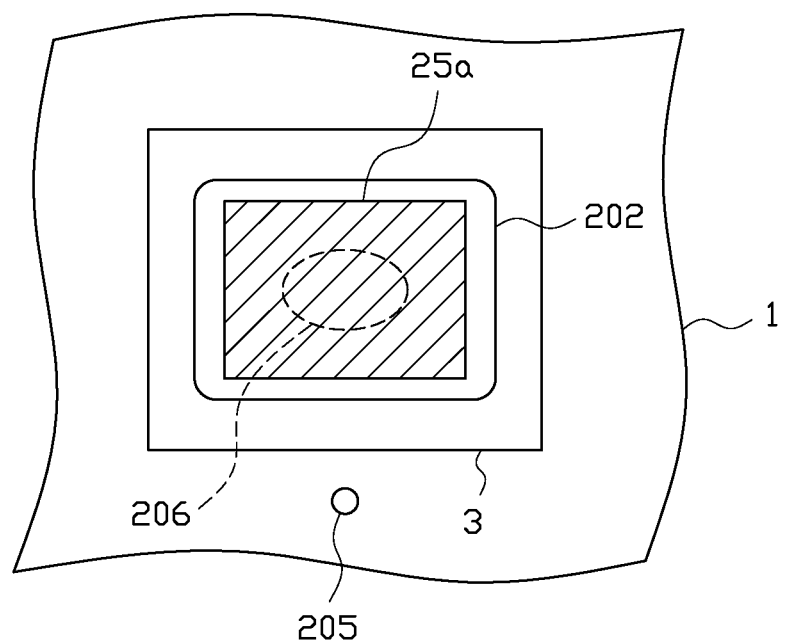

The post-reflow inspection device 16 performs a post-reflow inspection process of examining whether the solder-joining is performed appropriately in the reflow process. For example, the post-reflow inspection device 16 examiners whether there is any positional misalignment of the electronic component 25 or whether there is any solder ball 205 (shown in FIGS. 10A-10B) by using luminance image data or the like or examines whether there is any cavity 206 (shown in FIGS. 10A-10B) in a solder joint portion 202 by using X-ray transmission image data or the like.

Accordingly, the manufacturing line 10 performs the solder printing process, the solder printing inspection process, the component mounting process (the mounting process), the reflow process and the post-reflow inspection process in this sequence, while sequentially transferring the printed circuit board 1.

The manufacturing line 10 further includes conveyors or the like provided between the respective devices described above, for example, between the solder printing machine 12 and the solder printing inspection device 13 to transfer the printed circuit board 1, although the illustration is omitted. Furthermore, branching units are provided between the solder printing inspection device 13 and the component mounting machine 14 and in downstream of the post-reflow inspection device 16. The printed circuit board 1 determined as non-defective by the solder printing inspection device 13 and by the post-reflow inspection device 16 is guided to downstream, whereas the printed circuit board 1 determined as defective by the solder printing inspection device 13 or by the post-reflow inspection device 16 is discharged by the branching unit to a defective storage part.

Figure 3:
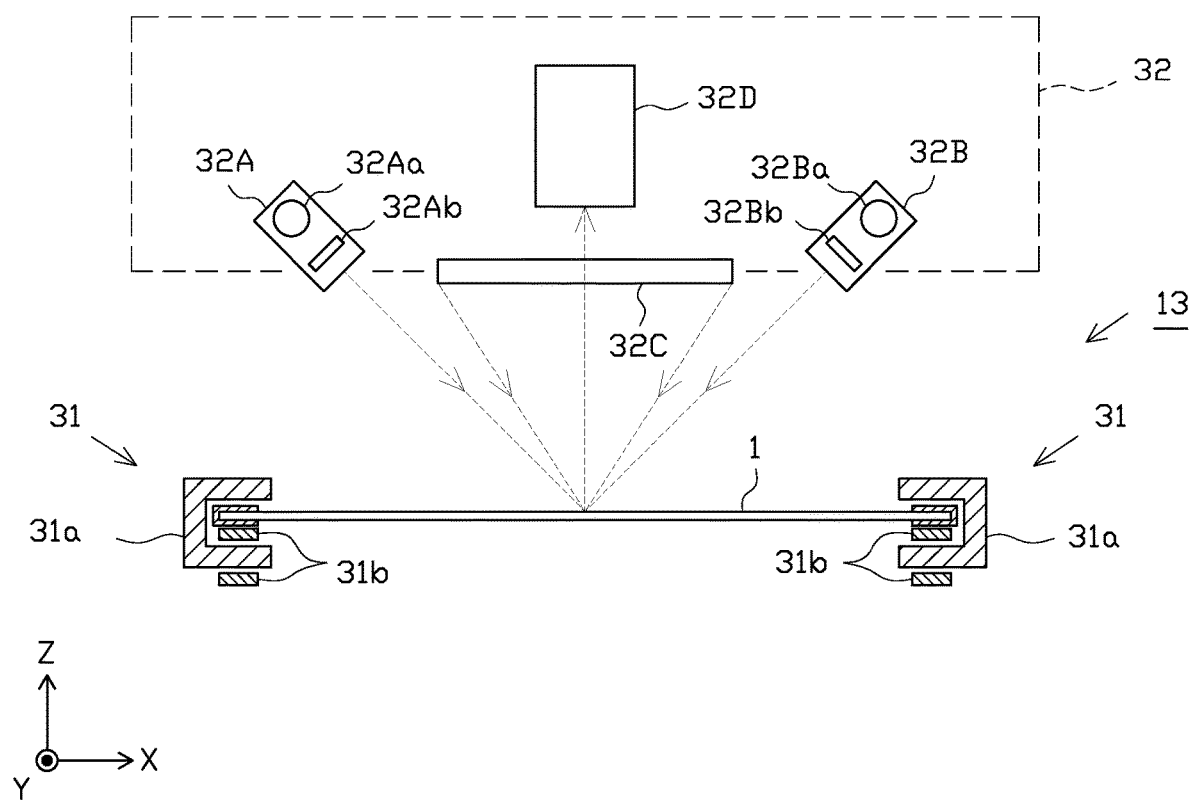
FIG. 3 is a schematic configuration diagram schematically illustrating a solder printing inspection device.
Figure 4:
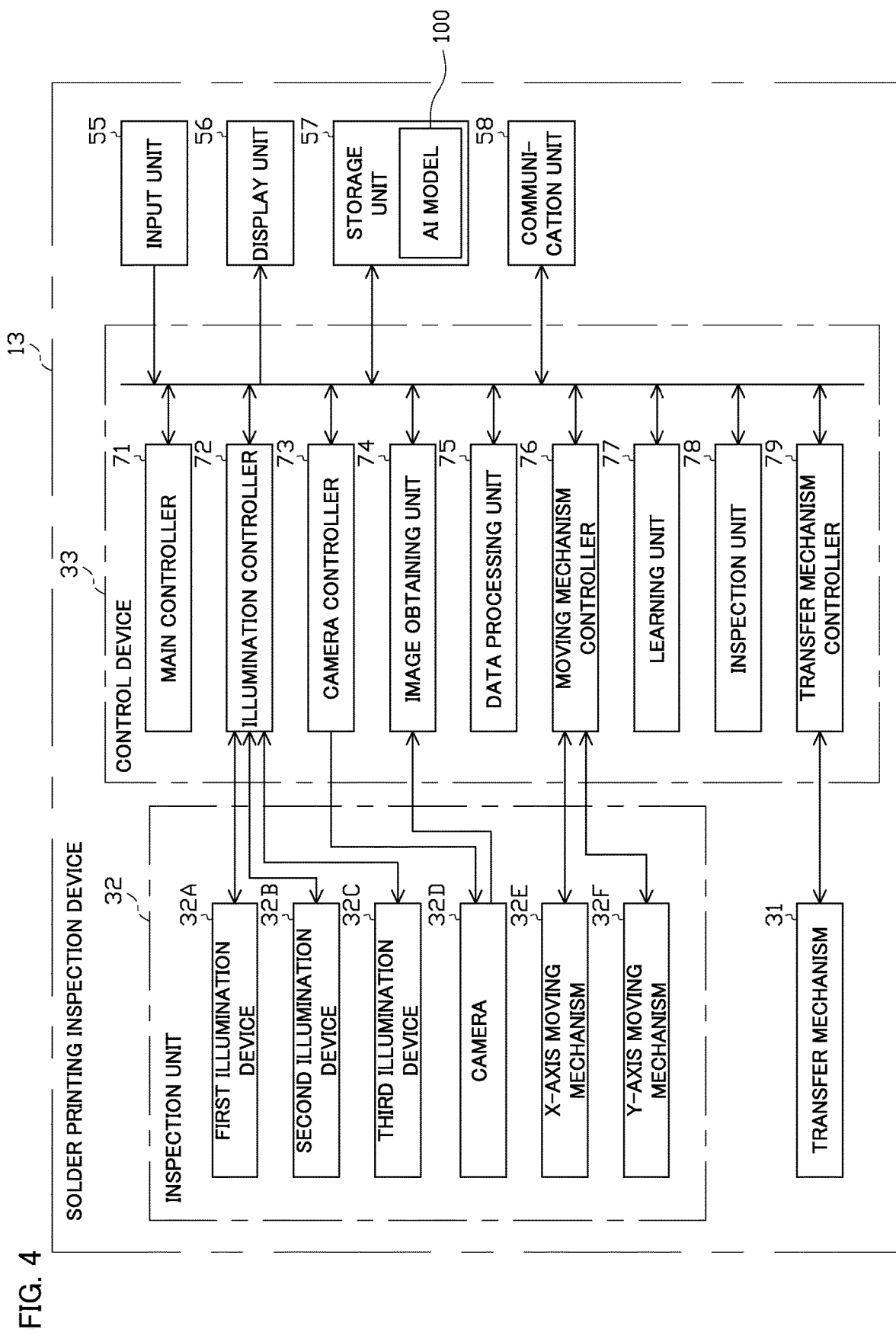
FIG. 4 is a block diagram illustrating the functional configuration of the solder printing inspection device.

The configuration of the solder printing inspection device 13 is described in detail with reference to FIG. 3 and FIG. 4. FIG. 3 is a schematic configuration diagram schematically illustrating the solder printing inspection device 13. FIG. 4 is a block diagram illustrating the functional configuration of the solder printing inspection device 13.

The solder printing inspection device 13 includes a transfer mechanism 31 configured to perform transfer, positioning and the like of the printed circuit board 1, an inspection unit 32 configured to perform an inspection of the printed circuit board 1, and a control device 33 (shown in FIG. 4) configured to perform drive control of the transfer mechanism 31 and the inspection unit 32, as well as various controls, image processing operations and arithmetic processing operations in the solder printing inspection device 13.

The transfer mechanism 31 includes a pair of transfer rails 31a arranged along a carrying in/out direction of the printed circuit board 1, an endless conveyor belt 31b placed to be rotatable relative to the respective transfer rails 31a, a driving unit (not shown), such as a motor, configured to drive the conveyor belt 31b, and a chuck mechanism (not shown) configured to position the printed circuit board 1 at a predetermined position. The transfer mechanism 31 is driven and controlled by the control device 33 (by a transfer mechanism controller 79 described later).

Under the configuration described above, when the printed circuit board 1 is carried into the solder printing inspection device 13, respective side edges of the printed circuit board 1 in a width direction perpendicular to the carrying in/out direction of the printed circuit board 1 are inserted into the transfer rails 31a, and the printed circuit board 1 is placed on the conveyor belt 31b. The conveyor belt 31b subsequently starts operation to transfer the printed circuit board 1 to a predetermined inspection position. When the printed circuit board 1 reaches the inspection position, the conveyor belt 31 stops and the chuck mechanism starts operation. The operation of this chuck mechanism presses up the conveyor belt 31b and causes the respective side edges of the printed circuit board 1 to be clamped by the conveyor belt 31b and upper sides of the transfer rails 31a. This positions and fixes the printed circuit board 1 at the inspection position. When the inspection is terminated, the fixation by the chuck mechanism is released, and the conveyor belt 31b starts operation. This carries out the printed circuit board 1 from the solder printing inspection device 13. The configuration of the transfer mechanism 31 is, however, not limited to this configuration described above, but another configuration may be employed for the transfer mechanism 31.

The inspection unit 32 is placed above the transfer rails 31a (above a transfer path of the printed circuit board 1). The inspection unit 32 includes a first illumination device 32A and a second illumination device 32B serving as the irradiation units for three-dimensional measurement; a third illumination device 32C serving as the irradiation unit for two-dimensional measurement; a camera 32D serving as the imaging unit configured to take an image of a predetermined inspection range on the printed circuit board 1 from directly above; an X-axis moving mechanism 32E (shown in FIG. 4) configured to allow for motion in an X-axis direction (left-right direction in FIG. 3); and a Y-axis moving mechanism 32F (shown in FIG. 4) configured to allow for motion in a Y-axis direction (front-back direction in FIG. 3). The inspection unit 32 is driven and controlled by the control device 33 (by a moving mechanism controller 76 described later).

The "inspection range" on the printed circuit board 1 is one area out of a plurality of areas set in advance in the printed circuit board 1 with the size of an imaging field of view (imaging range) of the camera 32D as one unit.

The control device 33 (the moving mechanism controller 76) drives and controls the X-axis moving mechanism 32E and the Y-axis moving mechanism 32F, so as to move the inspection unit 32 to a position above any arbitrary inspection range on the printed circuit board 1 positioned and fixed at the inspection position. The inspection unit 32 is sequentially moved to a plurality of inspection ranges set on the printed circuit board 1 and performs an inspection with regard to the respective inspection ranges, so as to perform an inspection with regard to the entire printed circuit board 1.

The first illumination device 32A and the second illumination device 32B serve to respectively irradiate a predetermined inspection range on the printed circuit board 1 obliquely downward with predetermined lights for three-dimensional measurement (patterned lights having striped light intensity distributions) in a process of performing three-dimensional measurement of the solder pastes 5.

More specifically, the first illustration device 32A includes a first light source 32Aa configured to emit predetermined light and a first liquid crystal shutter 32Ab configured to form a first grating that serves to convert the light emitted from the first light source 32Aa into a first patterned light having a striped light intensity distribution, and is driven and controlled by the control device 33 (by an illumination controller 72 described later).

The second illumination device 32B includes a second light source 32Ba configured to emit predetermined light and a second liquid crystal shutter 32Bb configured to form a second grating that serves to convert the light emitted from the second light source 32Ba into a second patterned light having a striped light intensity distribution, and is driven and controlled by the control device 33 (by the illumination controller 72 described later).

Under the configuration described above, the lights emitted from the respective light sources 32Aa and 32Ba are respectively led to condenser lenses (not shown) to become parallel lights and are then led to projection lenses (not shown) via the liquid crystal shutters 32Ab and 32Bb to be projected as the patterned lights on the printed circuit board 1. According to one or more embodiments, the liquid crystal shutters 32Ab and 32Bb are subjected to switching control to shift the phases of the respective patterned lights by every ¼ pitches.

Using the liquid crystal shutters 32Ab and 32Bb as the gratings allows for radiation of the patterned lights approximate to an ideal sinusoidal wave. This configuration improves the measurement resolution of three-dimensional measurement. This configuration also allows for electrical phase shift control of the patterned lights and thereby achieves size reduction of the apparatus.

The third illumination device 32C is configured to irradiate the predetermined inspection range on the printed circuit board 1 with predetermined light for two-dimensional measurement (for example, uniform light) in a process of performing two-dimensional measurement for extraction of various areas such as the lands 3 and the solder pastes 5 on the printed circuit board 1.

More specifically, the third illumination device 32C includes a ring light configured to emit blue light, a ring light configured to emit green light, and a ring light configured to emit red light. The third illumination device 32C has a configuration similar to a configuration of known art and is accordingly not described in detail herein.

The camera 32D includes an imaging element, such as a CCD (Charge Coupled Device)-type image sensor or a CMOS (Complementary Metal Oxide Semiconductor)-type image sensor and an optical system (for example, a lens unit and a diaphragm) configured to focus an image of the printed circuit board 1 on the imaging element, and is arranged such that an optical axis of the camera 32D is along a vertical direction (Z-axis direction). The imaging element is, however, not limited to these examples, but another imaging element may be employed.

The camera 32D is driven and controlled by the control device 33 (by a camera controller 73 described later). More specifically, the control device 33 performs an imaging process by the camera 32D, in synchronism with an irradiation process by the respective illumination devices 32A, 32B and 32C. This configuration enables an image of a light that is emitted from one of the illumination devices 32A, 32B and 32C and that is reflected by the printed circuit board 1, to be taken by the camera 32D and thereby generates image data.

The camera 32D according to one or more embodiments is configured by a color camera. This configuration enables an image of the lights of the respective colors, which are simultaneously emitted from the respective color ring lights of the third illumination device 32C and that are reflected by the printed circuit board 1, to be taken at a time.

Image data taken and generated by the camera 32D are converted into digital signals inside of the camera 32D and are transferred in the form of digital signals to the control device 33 (to an image obtaining unit 74 described later) to be stored therein. The control device 33 (for example, a data processing unit 75 described later) performs various image processing operations, arithmetic processing operations and the like described later, based on the image data.

The control device 33 is configured by a computer including, for example, a CPU (Central Processing Unit) that performs predetermined arithmetic processing operations, a ROM (Read Only Memory) that stores a variety of programs, fixed value data and the like, a RAM (Random Access Memory) that temporarily stores various data in the course of performing the various arithmetic processing operations, and peripheral circuits thereof.

As the CPU operates according to the variety of programs, the control device 33 serves as various functional parts including a main controller 71, the illumination controller 72, the camera controller 73, the image obtaining unit 74, the data processing unit 75, the moving mechanism controller 76, a learning unit 77, an inspection unit 78 and the transfer mechanism controller 79 described later.

The various functional parts described above are implemented by cooperation of various hardware components including the CPU, the ROM and the RAM described above. There is no need to distinctively differentiate the functions implemented by the software from the functions implemented by the hardware. Part or the entirety of these functions may be implemented by hardware circuits such as ICs.

The control device 33 is further provided with, for example, an input unit 55 configured by a keyboard and a mouse, a touch panel or the like, a display unit 56 having a display screen, such as a liquid crystal display, a storage unit 57 configured to store, for example, various data, programs, calculation results and inspection results, and a communication unit 58 configured to send and receive various data to and from outside.

The following describes the above various functional parts constituting the control device 33 in detail. The main controller 71 is a functional part serving to control the solder printing inspection device 13 as a whole and is configured to send and receive various signals to and from the other functional parts, such as the illumination controller 72 and the camera controller 73.

The illumination controller 72 is a functional part serving to drive and control the illumination devices 32A, 32B and 32C and is configured to perform, for example, switching control of irradiation light, in response to a command signal from the main controller 71.

The camera controller 73 is a functional part serving to drive and control the camera 32D and is configured to control, for example, an imaging timing, in response to a command signal from the main controller 71.

The image obtaining unit 74 is a functional part serving to take in image data taken and obtained by the camera 32D.

The data processing unit 75 is a functional part serving to process image data taken in by the image obtaining unit 74 by a predetermined image processing operation and to perform a two-dimensional measurement process and a three-dimensional measurement process by using the image data. For example, the data processing unit 75 generates shape data for learning (upper portion shape data for learning) that is learning data used for learning of a deep neural network 90 (hereinafter simply referred to as "neural network 90", shown in FIG. 5) in a learning process described later. The data processing unit 75 also generates shape data for upper portion inspection (upper portion shape data for inspection) in an inspection process described later.

The moving mechanism controller 76 is a functional part serving to drive and control the X-axis moving mechanism 32E and the Y-axis moving mechanism 32F and is configured to control the position of the inspection unit 32, in response to a command signal from the main controller 71.

The learning unit 77 is a functional part serving to perform learning of the neural network 90 by using learning data and the like and to build an AI (Artificial Intelligence) model 100 as an identification unit.

The AI model 100 according to one or more embodiments is a generated model built by deep learning of the neural network 90 with using only upper portion shape data of the solder pastes 5 measured in the process of a solder printing inspection of the non-defective printed circuit board 1 where no abnormality (soldering defect) is observed after reflow, as learning data, and has the structure of an autoencoder, as described later.

Figure 5:
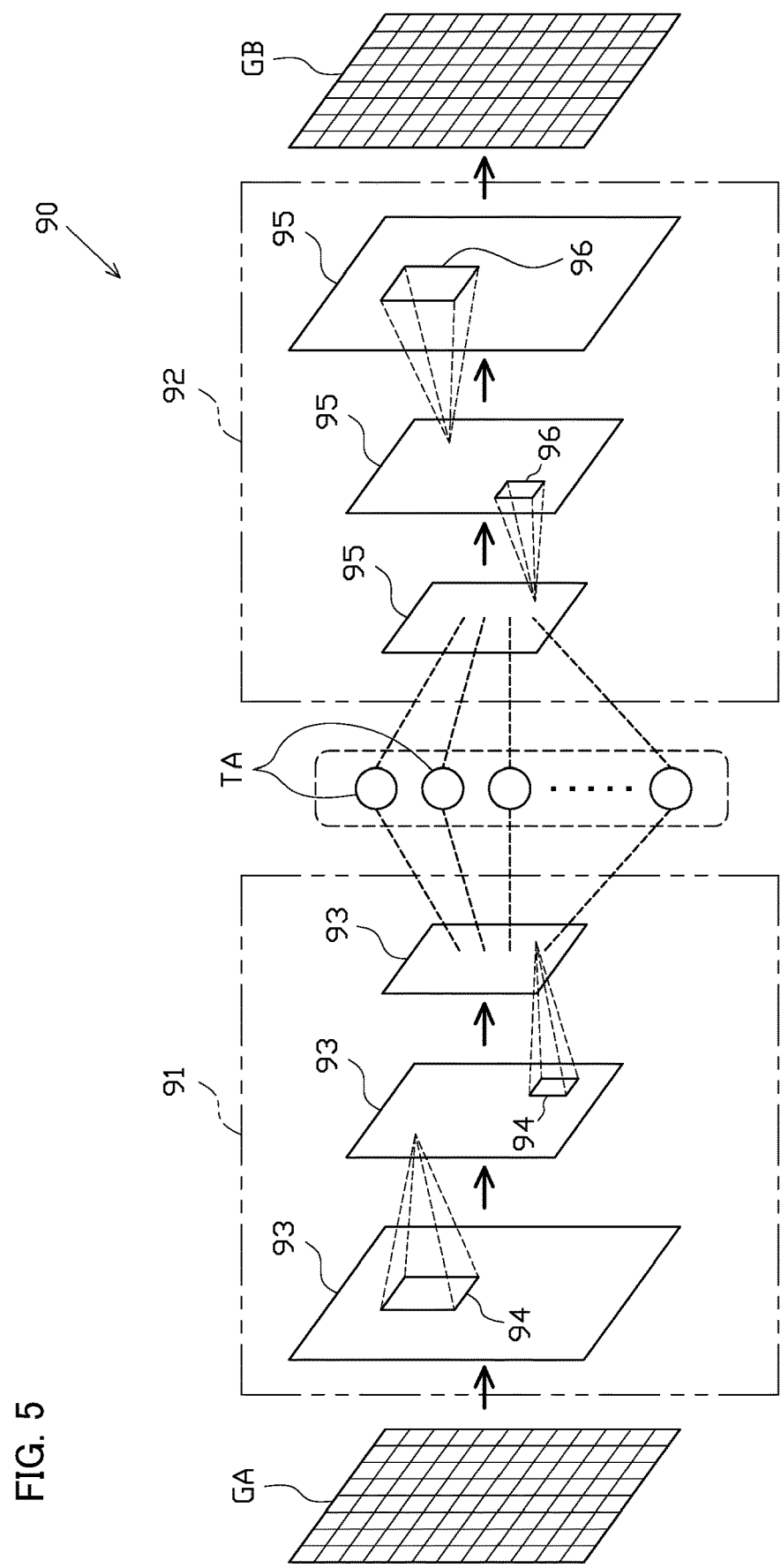
FIG. 5 is a schematic diagram illustrating the structure of a neural network.

The following describes the structure of the neural network 90 with reference to FIG. 5. FIG. 5 is a schematic diagram conceptually illustrating the structure of the neural network 90. As shown in FIG. 5, the neural network 90 has the structure of a convolutional autoencoder (CAE) that includes an encoder unit 91 serving as an encoding portion to extract a characteristic amount (latent variable) TA from input shape data GA and a decoder unit 92 serving as a decoding portion to reconstruct shape data GB from the characteristic amount TA.

The structure of the convolutional autoencoder is known in the art and is not described in detail herein. The encoder unit 91 has a plurality of convolution layers 93. Each convolution layer 93 is configured to output a result of a convolution operation of input data using a plurality of filters (kernels) 94, as input data of a next layer. Similarly, the decoder unit 92 has a plurality of deconvolution layers 95. Each deconvolution layer 95 is configured to output a result of a deconvolution operation of input data using a plurality of filters (kernels) 96, as input data of a next layer. A weight (parameter) of each of the filters 94 and 96 is updated in a learning process described later.

Figure 9A:
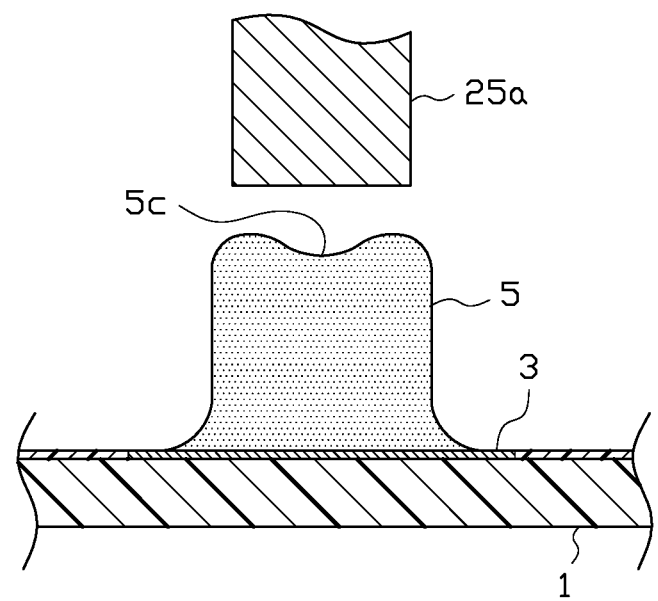
FIGS. 9A-9B are each partly enlarged sectional views of a printed circuit board illustrating a solder paste with a shape defect printed on a land and its periphery.
Figure 9B:
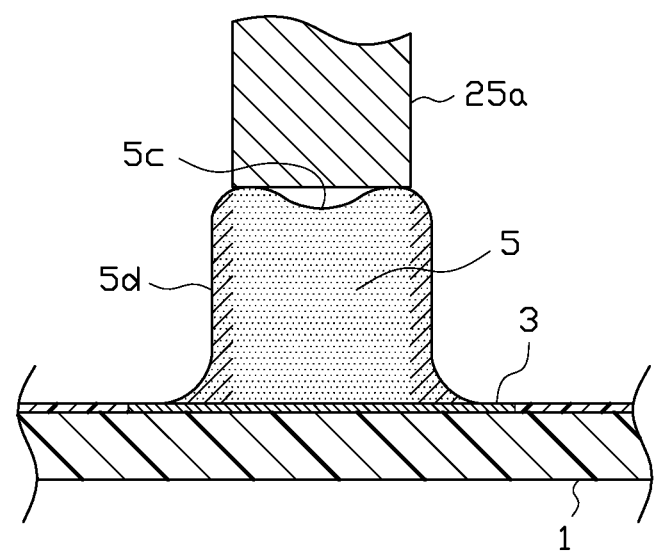

The inspection unit 78 is a functional part serving to perform an inspection for the printing state of the solder paste 5 printed on the printed circuit board 1. For example, according to one or more embodiments, the inspection unit 78 performs a three-dimensional shape inspection to determine whether there is any location of a shape defect, such as a recess 5c (as shown in FIGS. 9A-9B), in the solder paste 5 printed on the land 3.

The transfer mechanism controller 79 is a functional part serving to drive and control the transfer mechanism 31 and is configured to control the position of the printed circuit board 1, in response to a command signal from the main controller 71.

The storage unit 57 is configured by, for example, an HDD (Hard Disk Drive) or an SSD (Solid State Drive) and has, for example, a predetermined storage area provided to store the AI model 100 (the neural network 90 and learnt information obtained by learning of the neural network 90).

The communication unit 58 includes a wireless communication interface or the like in conformity with a communications standard, such as a wired LAN (Local Area Network) or a wireless LAN, and is configured to send and receive various data to and from outside. For example, results of an inspection performed by the inspection unit 78 are output via the communication unit 58 to outside, and results of an inspection performed by the post-reflow inspection device 16 are input via the communication unit 58.

Figure 6:
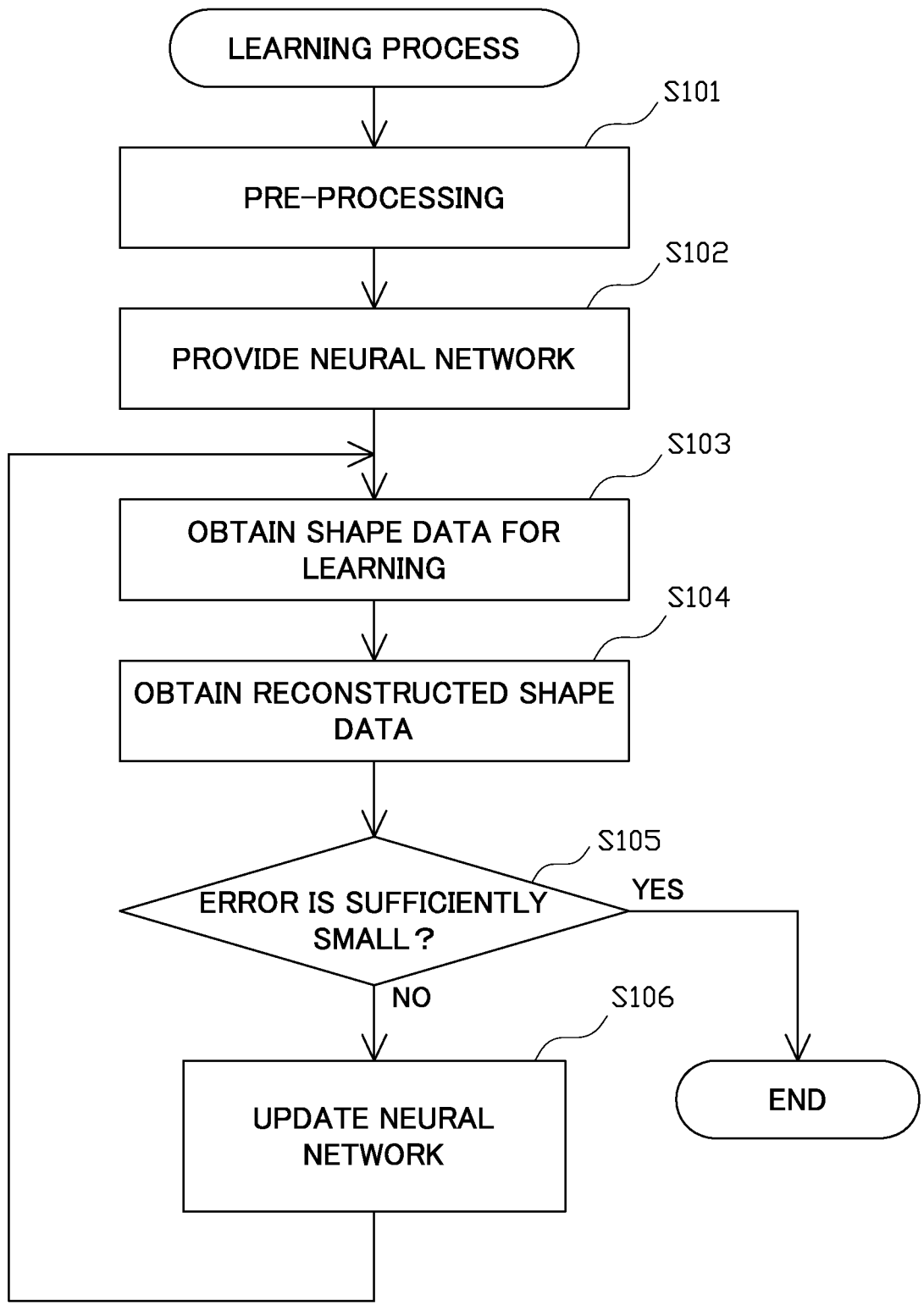
FIG. 6 is a flowchart showing a flow of a learning process of the neural network.

The following describes a learning process of the neural network 90 performed by the solder printing inspection device 13 with reference to the flowchart of FIG. 6.

When the learning process is started by executing a predetermined learning program, the main controller 71 first performs pre-processing for learning of the neural network 90 at step S101.

In this pre-processing, the main controller 71 first obtains inspection information of a large number of printed circuit boards 1 stored in the post-reflow inspection device 16 via the communication unit 58. The main controller 71 subsequently obtains three-dimensional measurement data with regard to the non-defective printed circuit board 1 that has passed a post-reflow inspection and that has no soldering defect (three-dimensional measurement data of a large number of solder pastes 5 measured in the process of a solder printing inspection), from the storage unit 57. This process is repeated until a required number of three-dimensional measurement data of the solder pastes 5 are obtained as learning data.

It is preferable that the printed circuit board 1 as the subject for obtaining the inspection information from the post-reflow inspection device 16 has an identical configuration with the configuration of the printed circuit board 1 as an inspection object. The printed circuit board 1 is, however, not required to have, for example, an identical thickness, an identical material, an identical size, or an identical arrangement layout. Learning based on various different types of learning data is preferable in terms of the general versatility.

When a required number of three-dimensional measurement data of the solder pastes 5 for learning are obtained at step S101, the learning unit 77 provides an unlearnt neural network 90, in response to a command from the main controller 71 at subsequent step S102. For example, the learning unit 77 reads out a neural network 90 stored in advance in the storage unit 57 or the like. In another example, the learning unit 77 builds a neural network 90, based on network configuration information (for example, the number of layers of a neural network and the number of nodes in each layer) stored in the storage unit 57 or the like.

At step S103, shape data for learning (upper portion shape data for learning) is obtained as learning data. More specifically, in response to a command from the main controller 71, the data processing unit 75 refers to the three-dimensional measurement data with regard to the printed circuit board 1 obtained at step S101 to extract one solder paste 5 out of the large number of solder pastes 5 included in the three-dimensional measurement data, and obtains upper portion shape data with regard to an upper portion 5b of the extracted solder paste 5 having a height equal to or higher than a predetermined height H (as shown in FIG. 8C), as one shape data for learning. This shape data for learning is output to the learning unit 77. Accordingly, only upper portion shape data with regard to an upper portion 5b of a pre-reflowed, non-defective solder paste 5 printed on the land 3 of the non-defective printed circuit board 1 where no soldering defect is observed after reflow, is used as learning data (shape data for learning).

At step S104, reconstructed shape data is obtained. More specifically, in response to a command from the main controller 71, the learning unit 77 gives the shape data for learning obtained at step S103, as input data, to an input layer of the neural network 90 and obtains reconstructed shape data that is output, as a result of the input, from an output layer of the neural network 90.

At subsequent step S105, the learning unit 77 compares the shape data for learning obtained at step S103 with the reconstructed shape data output from the neural network 90 at step S104 and determines whether or not an error is sufficiently small (whether or not an error is equal to or smaller than a predetermined reference value).

When the error is sufficiently small, the learning unit 77 stores the neural network 90 and learning information thereof (for example, updated parameters described later) as the AI model 100 into the storage unit 57 and terminates this learning process.

When the error is not sufficiently small, on the other hand, the learning unit 77 performs a network updating process (learning of the neural network 90) at step S106 and returns to step S103 to repeat the above series of processing.

More specifically, the network updating process at step S106 uses a known learning algorithm, for example, a backpropagation algorithm, and updates weights (parameters) of the respective filters 94 and 96 described above in the neural network 90 to more appropriate values, such as to minimize a loss function indicating a difference between the shape data for learning and the reconstructed shape data. For example, a BCE (Binary Cross-entropy) may be used as the loss function.

Repeating the series of processing a number of times minimizes the error between the shape data for learning and the reconstructed shape data and enables the neural network 90 to output the reconstructed shape data of the higher accuracy.

Figure 7:
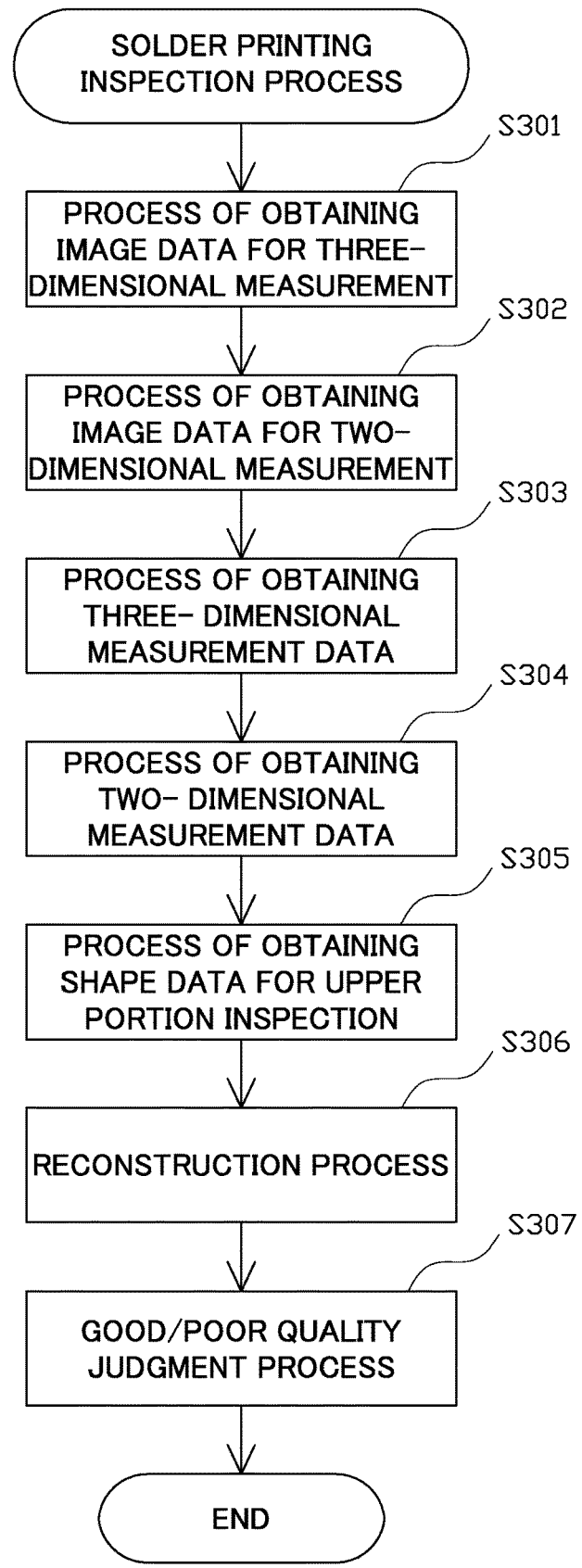
FIG. 7 is a flowchart showing a flow of a solder printing inspection process.

The following describes a solder printing inspection process performed by the solder printing inspection device 13 with reference to the flowchart of FIG. 7. The inspection process shown in FIG. 7 is a process performed for each predetermined inspection range of the printed circuit board 1.

When the printed circuit board 1 is carried into the solder printing inspection device 13 and is positioned at a predetermined inspection position, the inspection process is started by executing a predetermined inspection program.

On the start of the inspection process, a process of obtaining image data for three-dimensional measurement is performed first at step S301. In an inspection with regard to each inspection range of the printed circuit board 1, a procedure of one or more embodiments performs four imaging processes under the first patterned light of different phases with changing the phase of the first patterned light emitted from the first illumination device 32A and subsequently performs four imaging processes under the second patterned light of different phases with changing the phase of the second patterned light emitted from the second illumination device 32B, so as to obtain a total of eight image data. This procedure is described in detail below.

As described above, when the printed circuit board 1 carried into the solder printing inspection device 13 is positioned and fixed at the predetermined inspection position, in response to a command from the main controller 71, the moving mechanism controller 76 first drives and controls the X-axis moving mechanism 32E and the Y-axis moving mechanism 32F to move the inspection unit 32 and adjusts an imaging field of view (imaging range) of the camera 32D to a predetermined inspection range of the printed circuit board 1.

In the meanwhile, the illumination controller 72 performs switching control of the liquid crystal shutters 32Ab and 32Bb of the respective illumination devices 32A and 32B to set the positions of the first grating and the second grating formed by the respective liquid crystal shutters 32Ab and 32Bb to predetermined reference positions.

On completion of the switching setting of the first grating and the second grating, the illumination controller 72 turns on the first light source 32Aa of the first illumination device 32A to emit the first patterned light, and the camera controller 73 drives and controls the camera 32D to perform a first imaging process under the first patterned light. Image data generated by the imaging process are occasionally taken into the image obtaining unit 74 (the same applies hereinafter). The image obtaining unit 74 accordingly obtains area image data of the inspection area including a plurality of lands 3 (solder pastes 5).

Simultaneously with termination of the first imaging process under the first patterned light, the illumination controller 72 turns off the first light source 32Aa of the first illumination device 32A and performs a switching process of the first liquid crystal shutter 32Ab. More specifically, the illumination controller 72 switches the setting of the position of the first grating formed by the first liquid crystal shutter 32Ab from the reference position to a second position having the phase of the first patterned light shifted by ¼ pitches (90 degrees).

On completion of the switching setting of the first grating, the illumination controller 72 turns on the light source 32Aa of the first illumination device 32A to emit the first patterned light, and the camera controller 73 drives and controls the camera 32D to perform a second imaging process under the first patterned light. This series of processing is repeated, so as to obtain four area image data under the first patterned light of the different phases shifted by every 90 degrees.

The illumination controller 72 subsequently turns on the second light source 32Ba of the second illumination device 32B to emit the second patterned light, and the camera controller 73 drives and controls the camera 32D to perform a first imaging process under the second patterned light.

Simultaneously with termination of the first imaging process under the second patterned light, the illumination controller 72 turns off the second light source 32Ba of the second illumination device 32B and performs a switching process of the second liquid crystal shutter 32Bb. More specifically, the illumination controller 72 switches the setting of the position of the second grating formed by the second liquid crystal shutter 32Bb from the reference position to a second position having the phase of the second patterned light shifted by ¼ pitches (90 degrees).

On completion of the switching setting of the second grating, the illumination controller 72 turns on the light source 32Ba of the second illumination device 32B to emit the second patterned light, and the camera controller 73 drives and controls the camera 32D to perform a second imaging process under the second patterned light. This series of processing is repeated, so as to obtain four area image data under the second patterned light of the different phases shifted by every 90 degrees.

At subsequent step S302, a process of obtaining image data for two-dimensional measurement is performed. According to one or more embodiments, in an inspection with regard to each inspection range of the printed circuit board 1, in response to a command from the main controller 71, the illumination controller 72 turns on the third illumination device 32C to irradiate a predetermined inspection range with the uniform light, and the camera controller 73 drives and controls the camera 32D to perform an imaging process under the uniform light. This takes an image of the predetermined inspection range on the printed circuit board 1 and obtains area image data (image data for two-dimensional measurement) with regard to the inspection range.

At subsequent step S303, a process of obtaining three-dimensional measurement data is performed. More specifically, in response to a command from the main controller 71, the data processing unit 75 performs three-dimensional shape measurement of a predetermined inspection range including a plurality of solder pastes 5 by a known phase shift method, based on the four area image data respectively taken under each patterned light at step S301 as described above, and stores the results of the measurement (three-dimensional measurement data) into the storage unit 57. The function of performing this process configures the three-dimensional measurement unit according to one or more embodiments. The configuration of one or more embodiments performs the three-dimensional shape measurement with radiation of the patterned lights from two different directions and accordingly prevents the occurrence of a shadow portion that is not irradiated with any patterned light.

At subsequent step S304, a process of obtaining two-dimensional measurement data is performed. More specifically, in response to a command from the main controller 71, the data processing unit 75 performs two-dimensional shape measurement of the predetermined inspection range including the plurality of solder pastes 5, based on the area image data taken under the uniform light at step S302 as described above, and stores the results of the measurement (two-dimensional measurement data) into the storage unit 57. The function of performing this process configures the two-dimensional measurement unit according to one or more embodiments.

At subsequent step S305, the data processing unit 75 obtains shape data for upper portion inspection (upper portion shape data for inspection) with regard to each solder paste 5.

More specifically, in response to a command from the main controller 71, the data processing unit 75 refers to the area measurement data with regard to the predetermined inspection range obtained at step S303 as described above to specify all the plurality of solder pastes 5 included in the area measurement data, and extracts three-dimensional measurement data with regard to each of the solder pastes 5.

The data processing unit 75 subsequently extracts upper portion shape data with regard to an upper portion 5b of each solder paste 5 having the height equal to or higher than a predetermined height H. The function of performing this process configures the upper portion shape data extraction unit according to one or more embodiments.

More specifically, the data processing unit 75 excludes lower portion shape data with regard to a lower portion of the solder paste 5 that includes the spread portion 5a and that has the height lower than the predetermined height H, from the three-dimensional measurement data of each solder paste 5, so as to extract the upper portion shape data with regard to the upper portion 5b.

The "predetermined height H" herein may be set arbitrarily except a predetermined height reference plane (measurement reference plane). For example, the "predetermined height H" may be (1) a height corresponding to one particle diameter of solder from a predetermined height reference plane, such as an upper face of a land 3 or an upper face of a resist film 4; (2) a height of 20 to 40 μm from the predetermined height reference plane; (3) a height of one third of the printing height of a non-defective solder paste; or (4) a height of one third of the thickness of a screen mask used in the process of solder printing. The "predetermined height H" is, however, not limited to these examples, but another value may be set for the "predetermined height H".

The data processing unit 75 subsequently numbers the extracted upper portion shape data and registers the numbered upper portion shape data as original upper portion shape data with regard to the respective solder pastes 5. This process obtains, for example, original upper portion shape data with regard to an upper portion 5b of a solder paste 5 without any location of a shape defect (as shown in, for example, FIG. 8B) and original upper portion shape data with regard to an upper portion 5b of a solder paste 5 with some location of a shape defect, such as a recess 5c (as shown in, for example, FIGS. 9A-9B).

At step S306, a reconstruction process (a process of obtaining reconstructed shape data) is performed. The function of performing this process configures the reconstructed shape data obtaining unit according to one or more embodiments.

More specifically, in response to a command from the main controller 71, the inspection unit 78 inputs the original upper portion shape data with regard to a solder paste 5 of a predetermined number (for example, No. 001) obtained at step S305, into an input layer of the AI model 100. The inspection unit 78 subsequently obtains upper portion shape data reconstructed by the AI model 100 and output from an output layer of the AI model 100, as reconstructed upper portion shape data with regard to the solder paste 5 of the predetermined number (for example, No. 001), and stores this reconstructed upper portion shape data in relation to the original upper portion shape data of the same number. This process accordingly obtains reconstructed upper portion shape data with regard to all the solder pastes 5 numbered and registered at step S305.

Figure 8B:
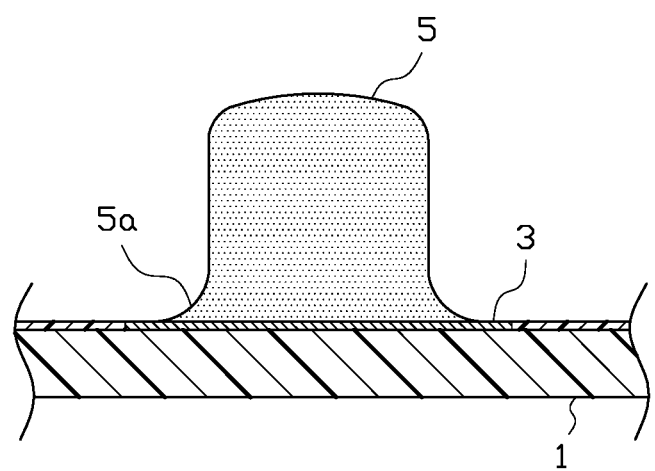
Figure 8C:
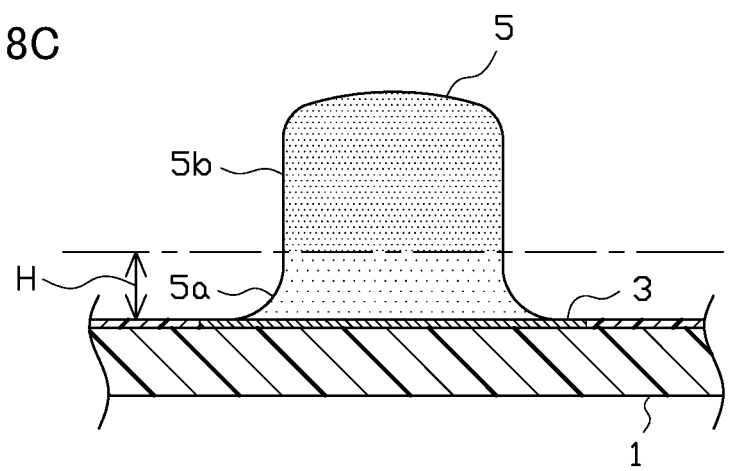

Even in the case of input of the original upper portion shape data with regard to the upper portion 5b of the solder paste 5 with some location of a shape defect as shown in FIG. 9A or the like, as well as in the case of input of the original upper portion shape data with regard to the upper portion 5b of the solder paste 5 without any location of a shape defect as shown in, for example, FIG. 8B or the like, the above learning enables the AI model 100 to output shape data with regard to an upper portion 5b of a solder paste 5 without any location of a shape defect like the example of FIG. 8B or the like, to be output as reconstructed upper portion shape data.

At step S307, a good/poor quality judgment process is performed, with regard to the printing state of the solder paste 5 printed on each of the lands 3.

A procedure of one or more embodiments includes a three-dimensional good/poor quality judgment process of performing good/poor quality judgment with regard to predetermined three-dimensional information relating to the solder pastes 5, a two-dimensional good/poor quality judgment process of performing good/poor quality judgment with regard to predetermined two-dimensional information relating to the solder pastes 5, and an upper portion shape good/poor quality judgment process of performing good/poor quality judgment with regard to three-dimensional shapes of the upper portions 5b of the solder pastes 5.

The three-dimensional good/poor quality judgment process performs good/poor quality judgement with regard to predetermined three-dimensional information relating to the solder pastes 5, based on the three-dimensional measurement data obtained by the process of obtaining three-dimensional measurement data at step S303 as described above. The function of performing this process configures the three-dimensional good/poor quality judgment unit according to one or more embodiments.

More specifically, in response to a command from the main controller 71, the inspection unit 78 calculates a "volume" and a "height" of each solder paste 5, based on the three-dimensional measurement data obtained at step S303 described above. The inspection unit 78 subsequently compares the calculated "volume" and "height" of the solder paste 5 with respective reference data stored in advance in the storage unit 57 and determines whether the "volume" and the "height" of the solder paste 5 are respectively within reference ranges. The good/poor quality judgment process of these inspection items (three-dimensional information) may be performed by a known method and is thus not described in detail herein.

The two-dimensional good/poor quality judgment process performs good/poor quality judgement with regard to predetermined two-dimensional information relating to the solder pastes 5, based on the two-dimensional measurement data obtained by the process of obtaining two-dimensional measurement data at step S304 as described above. The function of performing this process configures the two-dimensional good/poor quality judgment unit according to one or more embodiments.

More specifically, in response to a command from the main controller 71, the inspection unit 78 calculates an "area" and an "amount of positional misalignment" of each solder paste 5, based on the two-dimensional measurement data obtained at step S304 described above, and extracts a "two-dimensional shape" of the solder paste 5 and a "solder bridge" spanned between a plurality of the lands 3.

The inspection unit 78 subsequently compares the calculated "area" and "amount of positional misalignment" of the solder paste 5 and the extracted "two-dimensional shape" and "solder bridge" with respective reference data stored in advance in the storage unit 57 and determines whether these items are respectively within reference ranges. The good/poor quality judgment process of these inspection items (two-dimensional information) may be performed by a known method and is thus not described in detail herein.

In the upper portion shape good/poor quality judgment process, in response to a command from the main controller 71, the inspection unit 78 first compares the original upper portion shape data of an identical number obtained at step S305 described above with the reconstructed upper portion shape data of the identical number as a predetermined criterion obtained at step S306 described above and extracts a difference between these two shape data. The function of performing this process configures the comparison unit according to one or more embodiments.

The inspection unit 78 subsequently determines whether the difference between the two shape data corresponding to a location of a shape defect is larger than a predetermined reference value. When the difference between the two shape data is larger than the predetermined reference value, the inspection unit 78 determines the "presence of a shape defect". When the difference between the two shape data is smaller than the predetermined reference value, on the other hand, the inspection unit 78 determines the "absence of a shape defect".

For example, in the case where a recess 5c is present in a top portion of a solder paste 5 as shown in FIG. 9A and where the depth or the width of the recess 5c exceeds a predetermined reference value, the inspection unit 78 determines the "presence of a shape defect". The location determined as the "presence of a shape defect" by the upper portion shape good/poor quality judgment process is not limited to the location where the recess 5c is formed. For example, in the case where a solder paste 5 printed on a land 3 has a distorted shape and has a varying thickness, a thicker portion or the like is detected as a difference between the two shape data.

When all the results of the determinations by the "three-dimensional information good/poor quality judgment process", the "two-dimensional information good/poor quality judgment process", and the "upper portion shape good/poor quality judgment process" are "non-defective" with regard to a predetermined solder paste 5, the inspection unit 78 determines that the quality of the predetermined solder paste 5 is "non-defective" and stores this result into the storage unit 57.

When any of the results of the determinations by the "three-dimensional information good/poor quality judgment process", the "two-dimensional information good/poor quality judgment process", and the "upper portion shape good/poor quality judgment process" is "defective" with regard to a predetermined solder paste 5, on the other hand, the inspection unit 78 determines that the quality of the predetermined solder paste 5 is "defective" and stores this result into the storage unit 57.

When the results of the determination are "non-defective" with regard to all solder pasts 5 included in area measurement data (a predetermined inspection range of the printed circuit board 1), the inspection unit 78 determines that the quality of the inspection range relating to the area measurement data is "non-defective", stores this result into the storage unit 57, and terminates this process.

When there is even one solder paste 5 determined as "defective" out of the plurality of solder pastes 5 included in the area measurement data (the predetermined inspection range of the printed circuit board 1), on the other hand, the inspection unit 78 determines that the quality of the inspection range relating to the area measurement data is "defective", stores this result into the storage unit 57, and terminates this process.

When the results of the determination by the solder printing inspection process described above are "non-defective" with regard to all inspection ranges on the printed circuit board 1, the solder printing inspection device 13 determines that the printed circuit board 1 has no defect (pass result) and stores this result into the storage unit 57.

When there is even one inspection range determined as "defective" out of all the inspection ranges on the printed circuit board 1, on the other hand, the solder printing inspection device 13 determines that the printed circuit board 1 has a defective location (rejection result), stores this result into the storage unit 57, and notifies the outside of this result via the display unit 56, the communication unit 58 or the like.

As described above in detail, the configuration of one or more embodiments first obtains three-dimensional measurement data of a predetermined solder paste 5 printed on a printed circuit board 1, based on image data obtained by imaging the predetermined solder paste 5. The configuration of one or more embodiments subsequently extracts upper portion shape data with regard to an upper portion 5b of the predetermined solder paste 5 having the height equal to or higher than the predetermined height H, based on the three-dimensional measurement data of this predetermined solder paste 5. The configuration of one or more embodiments then compares this upper portion shape data with a predetermined criterion, so as to perform the good/poor quality judgment with regard to the three-dimensional shape of the upper portion 5b of the predetermined solder paste 5.

The configuration of one or more embodiments enables a location of a shape defect (for example, the recess 5c) of the solder paste 5 that is likely to cause a soldering defect (for example, the solder ball 205 or the cavity 206) found after reflow to be detected in advance in the solder printing inspection process prior to reflow. It is difficult to detect such a location of a shape defect by only a conventional inspection that performs the determination based on the comparison of, for example, the area, the height or the volume of each solder paste 5 printed on the printed circuit board 1. As a result, the configuration of one or more embodiments suppresses the occurrence of a soldering defect after reflow.

Furthermore, the configuration of one or more embodiments performs the good/poor quality judgment not with regard to the entire three-dimensional shape of the solder paste 5 printed on a predetermined land 3 of the printed circuit board 1 but with regard to the three-dimensional shape of only the upper portion 5b of the solder paste 5 (upper portion shape data). This configuration reduces the load of the processing, compared with the configuration of performing the good/poor quality judgment with regard to the entire solder paste 5.

The configuration of one or more embodiments excludes the three-dimensional shape inspection with regard to the lower portion (the spread portion 5a) of the solder paste 5 and thereby allows for the three-dimensional shape inspection of the solder paste 5 with the high inspection efficiency and the high inspection accuracy, which has conventionally been practically difficult.

Unlike the shapes of the non-defective solder pastes 5, the defective locations of defective solder pastes 5, which are likely to cause soldering defects, such as the solder ball 205 and the cavity 206 after reflow, have a variety of shapes. Even in the configuration of excluding the three-dimensional shape inspection with regard to the lower portion (the spread portion 5a) of the solder paste 5 and performing the good/poor quality judgment in the three-dimensional shape with regard to only the upper portion 5b of the solder paste 5 (upper portion shape data) as described above, it is substantially impossible to store all the possible patterns of defective shapes and to detect a defective shape of each solder paste 5 as an inspection target by pattern matching or the like.

The solder pastes 5 are formed by kneading fine solder particles of approximately 30 μm in size with a flux and readily collapse. The solder pastes 5 printed on the respective lands 3 on an identical printed circuit board 1 accordingly have various shapes. Even in a configuration of storing a predetermined non-defective shape as a criterion and determining shapes out of an allowable range of the criterion as defective, it is difficult to set the criterion and it may be significantly difficult to create an algorithm for detecting a location of a shape defect of the solder paste 5.

The configuration of one or more embodiments, on the other hand, uses the AI model 100 built by learning of the neural network 90 to determine whether the upper portion 5b of the solder paste 5 printed on the land 3 of the printed circuit board 1 has any location of a shape defect, which is likely to cause a soldering defect, such as the solder ball 205 or the cavity 206, after reflow. Unlike the conventional configuration that has difficulty in detecting the location of a shape defect, the configuration of one or more embodiments enables the location of a shape defect of the solder paste 5 to be detected with high accuracy.

Furthermore, the configuration of one or more embodiments compares the original upper portion shape data obtained by three-dimensional measurement of a predetermined solder paste 5 as an inspection target with reconstructed upper portion shape data (upper portion shape data reconstructed) obtained by reconstruction based on the original upper portion shape data. The two shape data to be compared with each other are free from the effects of differences in imaging conditions on the printed circuit board 1-side as the inspection object (for example, the arrangement position, the arrangement angle, and the deflection of the printed circuit board 1) and in imaging conditions on the solder printing inspection device 13-side (for example, the illumination state and the angle of view of the camera 32D). Accordingly, this configuration enables the location of a shape defect to be detected with the higher accuracy.

In the process of performing a three-dimensional shape inspection with regard to a solder paste 5 printed on a land 3 at a predetermined position on a printed circuit board 1, a configuration that needs, as a criterion for good/poor quality judgment, printing set information (for example, position data, dimension data and shape data) with regard to the land 3 at the predetermined position and the solder paste 5 printed on the land 3 as an inspection target stores in advance substrate design information such as gerber data, individually obtains printing set information with regard to a land 3 at a predetermined position and a solder paste 5 printed on the land 3 as each inspection target, and performs the good/poor quality judgment of a three-dimensional shape of the solder paste 5 printed on the land 3 at the predetermined position as the inspection target, based on comparison with the printing set information. This is likely to significantly lower the inspection efficiency. This also requires accurate positioning of the printed circuit board 1 at the inspection position.

The configuration of one or more embodiments, on the other hand, uses the AI model 100 that has learnt the solder pastes 5 to perform a three-dimensional shape inspection of the solder pastes 5 printed on the respective lands 3. There is accordingly no need to store in advance the printing set information with regard to a large number of lands 3 present on the printed circuit board 1 and the individual solder pastes 5 printed on the lands 3 or to refer to the printing set information for the three-dimensional shape inspection. This accordingly enhances the inspection efficiency.

Furthermore, for example, unlike a configuration that compares upper portion shape data obtained by three-dimensional measurement of an upper portion 5b of a solder paste 5 at a predetermined position as an inspection target with a predetermined criterion (non-defective upper portion shape data) set in advance corresponding to the predetermined position, the configuration of one or more embodiments does not require alignment of the inspection target with the criterion or adjustment such as rotation of the direction (posture) of the criterion relative to the inspection target, This configuration accordingly increases the speed of the three-dimensional shape inspection. As a result, this significantly reduces the required number of processing steps in the three-dimensional shape inspection of one solder paste 5 and significantly increases the processing speed of the inspection.

The present disclosure is not limited to the description of the above embodiments but may be implemented, for example, by configurations described below. The present disclosure may also be naturally implemented by applications and modifications other than those illustrated below.

(a) The configuration relating to the solder printing inspection is not limited to the configuration of the above embodiments, but other configurations may be employed.

(a-1) For example, the configuration of the above embodiments uses the AI model 100 to extract a difference between the original upper portion shape data and the reconstructed upper portion shape data and determines whether the upper portion 5b of the solder paste 5 has any location of a shape defect.

This configuration is, however, not essential. For example, a modification may not use the AI model 100 but may be configured to store in advance a three-dimensional reference shape (upper portion reference shape data) as a predetermined criterion, to compare a three-dimensional shape (upper portion shape data) of an upper portion 5b of a predetermined solder paste 5 printed on a land 3 at a predetermined position as an inspection object with a corresponding three-dimensional reference shape, and to determine whether a difference between the three-dimensional shape and the three-dimensional reference shape is within an allowable range, so as to determine whether the upper portion 5b of the solder paste 5 has any location of a shape defect.

The "criterion (three-dimensional reference shape)" set in advance may be, for example, upper portion shape data with regard to an upper portion 5b of a solder paste 5 that has a predetermined three-dimensional shape and that is regarded as a non-defective by an operator or may be upper portion shape data with regard to an upper portion 5b of a solder paste 5 prior to reflow printed on a land 3 at a predetermined position (at the same position as the position of the inspection target), which does not cause any soldering defect after reflow.

(a-2) The above embodiments are configured to exclude lower portion shape data with regard to a lower portion of a solder paste 5 that includes a spread portion 5a and that has the height of lower than the predetermined height H, from three-dimensional measurement data of the solder paste 5, so as to extract upper portion shape data with regard to an upper portion 5b of the solder paste 5.

The configuration of extracting the upper portion shape data is not limited to this configuration, but another configuration may be employed. For example, a modification may be configured to extract a portion above a certain height position that is lower by a predetermined distance than a height position at the top of a solder paste 5, as upper portion shape data with regard to an upper portion 5b of the solder paste 5.

(a-3) In the solder printing inspection process, the above embodiments are configured to perform the "three-dimensional good/poor quality judgment process" of performing the good/poor quality judgment with regard to predetermined three-dimensional information (the "volume" and the "height") of a solder paste 5, the "two-dimensional good/poor quality judgment process" of performing the good/poor quality judgment with regard to predetermined two-dimensional information (the "area", the "amount of positional misalignment", the "two-dimensional shape" and the "solder bridge") of the solder paste 5, and the "upper portion shape good/poor quality judgment process" of performing the good/poor quality judgment with regard to the three-dimensional shape of an upper portion 5b of the solder paste 5.

This configuration is, however, not essential, and a modified configuration may not perform the "three-dimensional good/poor quality judgment process" and/or the "two-dimensional good/poor quality judgment process".

(a-4) The above embodiments are configured to perform two-dimensional measurement of a solder paste 5, in order to perform the good/poor quality judgment with regard to predetermined two-dimensional information of the solder paste 5. This configuration is, however, not essential. A modification may be configured to perform the good/poor quality judgment with regard to predetermined two-dimensional information of a solder paste 5, based on three-dimensional measurement data of the solder paste 5 obtained by three-dimensional measurement.

This modification allows for omission of the configuration for two-dimensional measurement, for example, the third illumination device 32C for two-dimensional measurement and the process of obtaining image data for two-dimensional measurement (step S302). This simplifies the configuration.

(b) The measurement methods of the solder pastes 5 including the three-dimensional measurement method and the two-dimensional measurement method are not limited to those described in the above embodiments, but other configurations may be employed.

(b-1) For example, the above embodiments are configured to obtain four different image data under each patterned light of different phases shifted by every 90 degrees in the process of three-dimensional measurement by the phase shift method. The number of times of the phase shift and the amount of the phase shift are, however, not limited to those of the embodiments. Another number of times of the phase shift and another amount of the phase shift may be employed to achieve three-dimensional measurement by the phase shift method.

For example, a modification may be configured to obtain three different image data of different phases shifted by every 120 degrees (or every 90 degrees) and perform three-dimensional measurement. Another modification may be configured to obtain two different image data of different phases shifted by every 180 degrees (or every 90 degrees) and perform three-dimensional measurement.

(b-2) The above embodiments employ the phase shift method as the three-dimensional measurement method. This is, however, not essential, but another three-dimensional measurement method, for example, a light section method, a moire method, a focusing method or a spatial coding method, may be employed.

(c) The configuration of the AI model 100 (the neural network 90) as the identification unit and the learning method thereof are not limited to those of the above embodiments.

(c-1) For example, a modification may be configured to perform a process, such as a normalization process, of various data as needed basis, for example, in the learning process of the neural network 90 or in the reconstruction process in the solder printing inspection process, although not being specifically referred to in the above embodiments.

(c-2) The structure of the neural network 90 is not limited to the structure shown in FIG. 5. For example, the neural network 90 may be configured to have a pooling layer after the convolution layers 93. The neural network 90 may also be configured to have a different number of layers, a different number of nodes in each layer, and a different connection structure of the respective nodes.

(c-3) According to the embodiments described above, the AI model 100 (the neural network 90) is configured as the generated model having the structure of the convolutional autoencoder (CAE). This configuration is, however, not essential. The AI model 100 may be configured as a generated model having the structure of another type of autoencoder, for example, a variational autoencoder (VAE).

(c-4) The configuration of the above embodiments performs learning of the neural network 90 by the backpropagation algorithm. This configuration is, however, not essential. A modified configuration may perform learning by using any of other various learning algorithms.

(c-5) The neural network 90 may be configured by an exclusive AI processing circuit, such as an AI chip. In this case, a modified configuration may store only learning information including the parameters in the storage unit 57 and may cause the exclusive AI processing circuit to read out the learning information and set the learning information in the neural network 90, so as to configure the AI model 100.

(c-6) According to the embodiments described above, the control device 33 is provided with the learning unit 77 and is configured to perform learning of the neural network 90 inside of the control device 33. This configuration is, however, not essential. A modified configuration may omit the learning unit 77, as long as at least the AI model 100 (the learnt neural network 90) is stored in the storage unit 57. This modified configuration may perform learning of the neural network 90 outside of the control device 33 and store the learnt neural network 90 into the storage unit 57.

(c-7) The above embodiments are configured to use the shape data accumulated in the solder printing inspection device 13 by the previous solder printing inspections (the upper portion shape data with regard to the upper portion 5b of the non-defective solder paste 5 prior to reflow printed on the land 3 of the non-defective printed circuit board 1, which does not cause any soldering defect after reflow), as the learning data, based on the inspection information of a large number of printed circuit boards 1 accumulated in the post-reflow inspection device 16.

This configuration is, however, not essential. For example, upper portion shape data with regard to an upper portion 5b of a non-defective solder paste 5 having no shape defect, such as a recess or a localization, selected by the operator's visual observation after printing of solder pastes 5 may be used as learning data.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . printed circuit board, 3 . . . land, 5 . . . solder paste, 5a . . . spread portion, 12 . . . solder printing machine, 13 . . . solder printing inspection device, 15 . . . reflow device, 16 . . . post-reflow inspection device, 25 . . . electronic component, 25a . . . electrode, 32 . . . inspection unit, 32A, 32B, 32C . . . illumination devices, 32D . . . camera, 33 . . . control device, 77 . . . learning unit, 78 . . . inspection unit, 90 . . . neural network, 100 . . . AI model, 202 . . . solder joint portion, 205 . . . solder ball, 206 . . . cavity, H . . . predetermined height

What is claimed is:

1. A solder printing inspection device configured to perform a pre-reflow inspection for a printing state of a solder paste printed on a printed circuit board, the solder printing inspection device comprising:
   an illumination device that irradiates, with a predetermined light, the printed circuit board on which the solder paste is printed;
   an imaging device that takes an image of the printed circuit board irradiated with the predetermined light and obtains image data; and
   a control device that:
      based on the image data, obtains three-dimensional measurement data of the solder paste printed on the printed circuit board,
      based on the three-dimensional measurement data, extracts upper portion shape data of an upper portion of the solder paste, the upper portion having a height equal to or higher than a predetermined height, and
      compares the upper portion shape data with a predetermined criterion and determines whether a quality of a three-dimensional shape of the upper portion of the solder paste is good or poor, wherein
   the solder printing inspection device further comprises:
      a storage that stores a neural network and a model, wherein the neural network includes an encoding portion extracting a characteristic amount from input shape data and a decoding portion reconstructing shape data from the characteristic amount, and the model is generated by learning of the neural network using, as learning data, only upper portion shape data with regard to a non-defective solder paste, and
   the control device:
      inputs, as original upper portion shape data, the extracted upper portion shape data into the model, and obtains, as reconstructed upper portion shape data, the extracted upper portion shape data reconstructed by the model,
      compares the original upper portion shape data with the reconstructed upper portion shape data, and
      based on a comparison result, determines whether the quality of the three-dimensional shape is good or poor.

2. The solder printing inspection device according to claim 1, wherein
the control device extracts the upper portion shape data by excluding, from the three-dimensional measurement data, at least lower portion shape data of a lower portion of the solder paste, the lower portion including a spread portion of the solder paste and having a height lower than the predetermined height.

3. The solder printing inspection device according to claim 2, wherein
the illumination device radiates, as the predetermined light, a light for three-dimensional measurement, and
the control device obtains the three-dimensional measurement data based on the image data obtained through radiation of the light for three-dimensional measurement.

4. The solder printing inspection device according to claim 3, wherein
the control device determines, based on the three-dimensional measurement data, whether a quality of three-dimensional information on the solder paste is good or poor.

5. The solder printing inspection device according to claim 2, wherein
the control device determines, based on the three-dimensional measurement data, whether a quality of three-dimensional information on the solder paste is good or poor.

6. The solder printing inspection device according to claim 1, wherein
the illumination device radiates, as the predetermined light, a light for three-dimensional measurement, and
the control device obtains the three-dimensional measurement data based on the image data obtained through radiation of the light for three-dimensional measurement.

7. The solder printing inspection device according to claim 6, wherein
the control device determines, based on the three-dimensional measurement data, whether a quality of three-dimensional information on the solder paste is good or poor.

8. The solder printing inspection device according to claim 1, wherein
the control device determines, based on the three-dimensional measurement data, whether a quality of three-dimensional information on the solder paste is good or poor.

9. The solder printing inspection device according to claim 1, further comprising:
the control device determines, based on the three-dimensional measurement data, whether a quality of two-dimensional information on the solder paste is good or poor.

10. The solder printing inspection device according to claim 1, wherein
the illumination device radiates, as the predetermined light, a light for two-dimensional measurement, and
the control device:
obtains two-dimensional measurement data of the solder paste based on the image data obtained through radiation of the light for two-dimensional measurement, and
determines, based on the two-dimensional measurement data, whether a quality of two-dimensional information on the solder paste is good or poor.

* * * * *